(12) United States Patent
Jo et al.

(10) Patent No.: US 10,867,542 B2
(45) Date of Patent: Dec. 15, 2020

(54) ELECTROLUMINESCENCE DISPLAY

(71) Applicant: LG Display Co., Ltd., Seoul (KR)

(72) Inventors: Sunghak Jo, Paju-si (KR); Jaehee Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 57 days.

(21) Appl. No.: 16/027,323

(22) Filed: Jul. 4, 2018

(65) Prior Publication Data

US 2019/0019444 A1    Jan. 17, 2019

(30) Foreign Application Priority Data

Jul. 17, 2017    (KR) ......................... 10-2017-0090354

(51) Int. Cl.
*G09G 3/20* (2006.01)
*H01L 27/32* (2006.01)
(Continued)

(52) U.S. Cl.
CPC ......... *G09G 3/2003* (2013.01); *G09G 3/3233* (2013.01); *G09G 3/3258* (2013.01); *G09G 3/3266* (2013.01); *G09G 3/3291* (2013.01); *H01L 27/1214* (2013.01); *H01L 27/3213* (2013.01); *H01L 27/3218* (2013.01); *H01L 27/3246* (2013.01); *H01L 27/3262* (2013.01);
(Continued)

(58) Field of Classification Search
CPC .. G09G 3/2003; G09G 3/3233; G09G 3/3258; G09G 3/3291; G09G 3/3266; G09G 2330/10; G09G 2300/0426; G09G 2310/0264; G09G 2300/0819; H01L 27/3276; H01L 27/3213; H01L 27/3218; H01L 29/42384; H01L 29/41733; H01L 27/1214; H01L 51/5221; H01L 51/5206; H01L 27/3246; H01L 27/3262; H01L 27/3258; H01L 2251/568; H01L 51/5203; H01L 27/3248; H01L 27/3211
See application file for complete search history.

(56) References Cited

U.S. PATENT DOCUMENTS

2006/0124966 A1    6/2006    Oh et al.
2014/0292827 A1*   10/2014   Kang ................. G09G 3/3233
                                                          345/690
(Continued)

FOREIGN PATENT DOCUMENTS

CN    104700774        6/2015
JP    2005-331977 A    12/2005
(Continued)

OTHER PUBLICATIONS

Office Action dated Jun. 6, 2019 issued in co-pending Japanese patent application No. 2018-125996.

*Primary Examiner* — Amit Chatly
(74) *Attorney, Agent, or Firm* — Polsinelli PC

(57) ABSTRACT

The present disclosure provides an electroluminescence display comprising: a first substrate; subpixels arranged on the first substrate; and repair lines located on the first substrate, one for at least every two subpixels that emit light of the same color and are adjacent to each other, wherein the repair lines comprise one side having a contact point with an electrode of a first subpixel and the other side having a non-contact point with an electrode of a second subpixel.

10 Claims, 14 Drawing Sheets

(51) Int. Cl.
  *H01L 51/52*  (2006.01)
  *H01L 27/12*  (2006.01)
  *H01L 29/417* (2006.01)
  *H01L 29/423* (2006.01)
  *G09G 3/3266* (2016.01)
  *G09G 3/3291* (2016.01)
  *G09G 3/3258* (2016.01)
  *G09G 3/3233* (2016.01)

(52) U.S. Cl.
  CPC .... *H01L 27/3276* (2013.01); *H01L 29/41733* (2013.01); *H01L 29/42384* (2013.01); *H01L 51/5206* (2013.01); *H01L 51/5221* (2013.01); *G09G 2300/0426* (2013.01); *G09G 2300/0819* (2013.01); *G09G 2310/0264* (2013.01); *G09G 2330/10* (2013.01); *H01L 27/3258* (2013.01); *H01L 51/5203* (2013.01); *H01L 2251/568* (2013.01)

(56) References Cited

U.S. PATENT DOCUMENTS

| | | |
|---|---|---|
| 2015/0161943 A1 | 6/2015 | Shim et al. |
| 2016/0189593 A1* | 6/2016 | Lee .................. G09G 3/2003 345/691 |

FOREIGN PATENT DOCUMENTS

| | | |
|---|---|---|
| JP | 2007-156407 | 6/2007 |
| JP | 2014-228867 | 12/2014 |
| JP | 2015-127813 | 7/2015 |
| JP | 2015-228361 | 12/2015 |
| KR | 10-2006-0065808 A | 6/2006 |
| KR | 10-2015-0066971 A | 6/2015 |

\* cited by examiner

ELECTROLUMINESCENCE DISPLAY

CROSS-REFERENCE TO RELATED APPLICATION

This application claims the benefit of Korean Patent Application No. 10-2017-0090354, filed on Jul. 17, 2017, which is incorporated herein by reference for all purposes as if fully set forth herein in its entirety.

BACKGROUND OF THE DISCLOSURE

Field of the Disclosure

The present disclosure relates to an electroluminescence display.

Description of the Background

The market for displays which act as an intermediary between users and information is growing with the development of information technology. Thus, different types of display devices such as electroluminescence displays, liquid crystal displays, and plasma displays are increasingly used.

A display device comprises a display panel including a plurality of subpixels, drivers displaying the display panel, and a power supply part supplying electric power to the display panel. The drivers include a scan driver supplying scan signals (or gate signals) and a data driver supplying data signals to the display panel.

A process of manufacturing a display panel includes a deposition process and a repair process. The deposition process is a process in which a conductive layer, a metal layer, and an insulating layer are deposited on a substrate to form structures such as elements (including electrodes), power supply lines, and signal lines. The repair process is a process in which defects on the structures formed on the substrate are repaired or defective subpixels are turned into dark dots.

However, the conventionally proposed repair method involves the risk of aperture ratio loss (or transmission loss) and requires the structures used in the repair process to be cut away or removed. Thus, there is a need for improvements in production yield and tact time.

SUMMARY

The present disclosure provides an electroluminescence display comprising: a first substrate; subpixels arranged on the first substrate; and repair lines located on the first substrate, one for at least every two subpixels that emit light of the same color and are adjacent to each other, wherein the repair lines comprise one side having a contact point with an electrode of a first subpixel and the other side having a non-contact point with an electrode of a second subpixel.

BRIEF DESCRIPTION OF THE DRAWINGS

The accompany drawings, which are included to provide a further understanding of the disclosure and are incorporated on and constitute a part of this application illustrate aspects of the disclosure and together with the description serve to explain the principles of the disclosure.

In the drawings.

DESCRIPTION OF EXEMPLARY ASPECTS

Reference will now be made in detail aspects of the disclosure, examples of which are illustrated in the accompanying drawings.

Hereinafter, concrete aspects of the present disclosure will be described with reference to the accompanying drawings.

An electroluminescence display to be described below may be implemented as a television, a video player, a personal computer (PC), a home theater, a smartphone, a virtual reality device (VR), etc. The electroluminescence display to be described below is an organic electroluminescence display implemented based on an organic light-emitting diode (light-emitting element), for example. However, it should be noted that the electroluminescence display to be described below may be implemented based on an inorganic light-emitting diode.

Lastly, the terms "source and drain electrodes" of thin-film transistors of the organic light-emitting display to be described below may be used interchangeably for different types, but the term "gate electrode" is not interchangeable. Hence, the source and drain electrodes may be termed first and second electrodes so as not to limit them.

Figure 1:
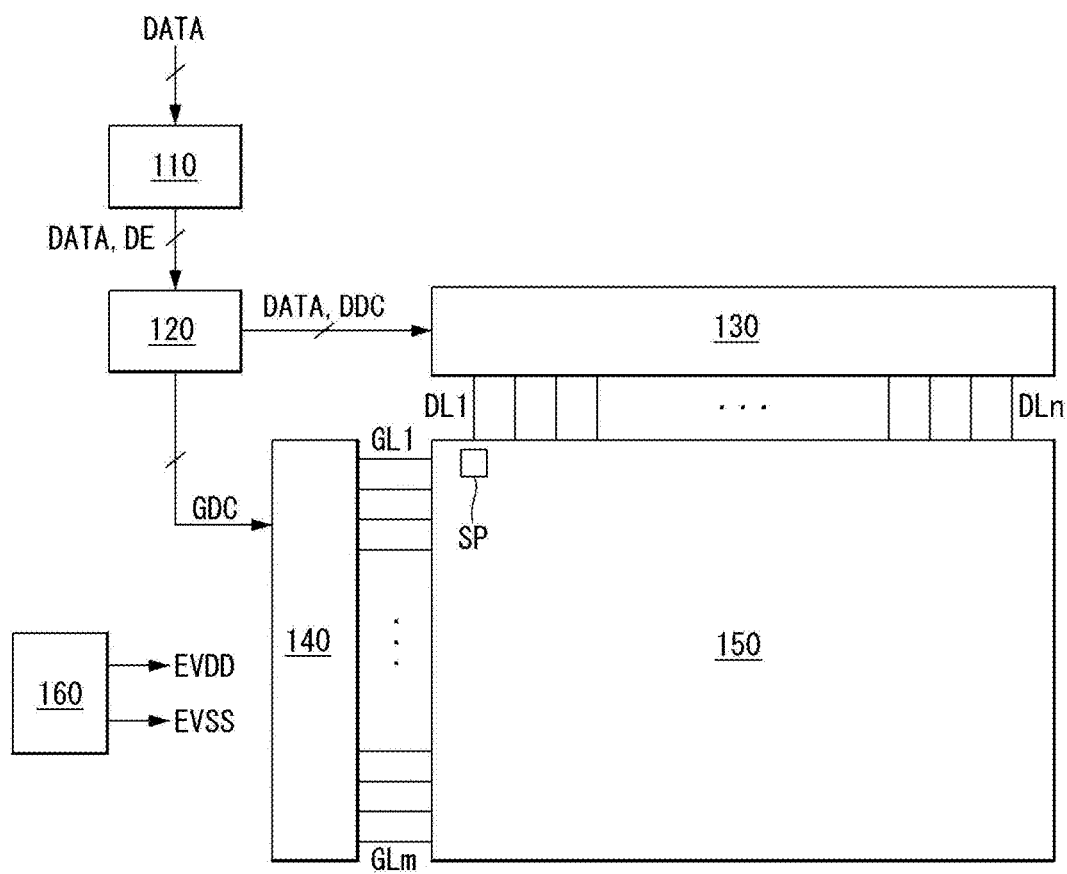
FIG. 1 is a schematic block diagram of an organic electroluminescence display.
Figure 2:
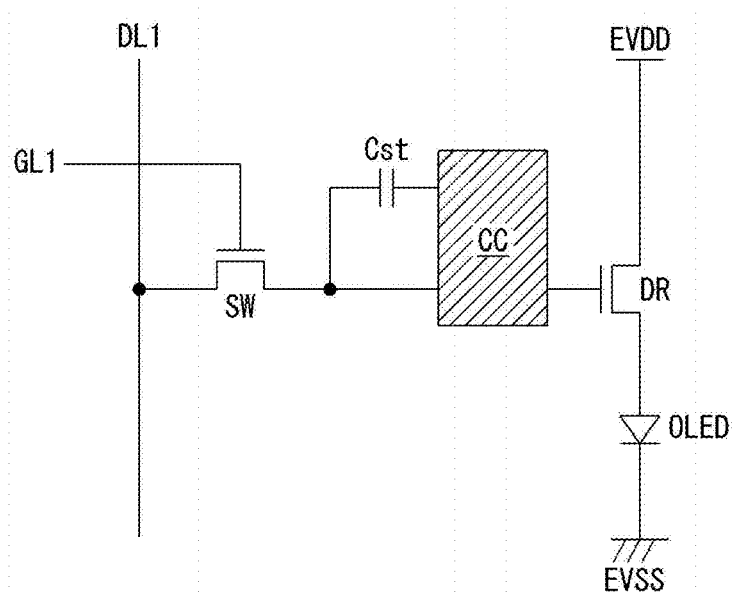
FIG. 2 is a schematic circuit diagram of a subpixel.

FIG. 1 is a schematic block diagram of an organic electroluminescence display. FIG. 2 is a schematic circuit diagram of a subpixel.

As shown in FIG. 1, the organic electroluminescence display includes an image processor 110, a timing controller 120, a data driver 130, a scan driver 140, a display panel 150, and a power supply part 160.

The image processor 110 outputs a data enable signal DE, along with externally supplied data signals DATA. The image processor 110 may output one or more among a vertical synchronization signal, a horizontal synchronization signal, and a clock signal, in addition to the data enable signal DE. These signals may be omitted in the drawings for convenience of explanation.

The timing controller 120 receives data signals DATA, along with the data enable signal DE or drive signals comprising a vertical synchronization signal, a horizontal synchronization signal, and a clock signal, from the image processor 110. The timing controller 120 outputs a gate timing control signal GDC for controlling the operation timing of the scan driver 140 and a data timing control signal DDC for controlling the operation timing of the data driver 130, based on the drive signals.

The data driver 140 samples and latches a data signal DATA supplied from the timing controller 120 in response to a data timing control signal DDC supplied from the timing controller 120, and converts it into a gamma reference voltage. The data driver 130 outputs data signals DATA through data lines DL1 to DLn. The data driver 130 may be provided in the form of an IC (integrated circuit).

The scan driver 140 outputs scan signals in response to a gate timing control signal GDC supplied from the timing controller 120. The scan driver 140 outputs scan signals through scan lines GL1 to GLm. The scan driver 140 may be provided in the form of an IC (integrated circuit) or formed on the display panel 150 using the gate-in-panel technology.

The power supply part 160 outputs a high-level voltage and a low-level voltage. The high-level voltage and low-level voltage outputted from the power supply part 160 are supplied to the display panel 150. The high-level voltage is supplied to the display panel 150 via a first power supply line EVDD, and the low-level voltage is supplied to the display panel 150 via a second power supply line EVSS.

The display panel 150 displays an image in response to data signals DATA and scan signals respectively supplied from the data driver 130 and scan driver 140 and power supplied from the power supply part 160. The display panel 150 comprises a first substrate, subpixels SP formed on the first substrate that work to display an image, and a second substrate that seals the subpixels SP along with the first substrate. The first substrate and the second substrate may be made of rigid material such as glass or flexible material such as resin.

The subpixels SP may include red subpixels, green subpixels, and blue subpixels, or may include white subpixels, red subpixels, green subpixels, and blue subpixels. The subpixels SP may have one or more different light-emission areas depending on the light-emission characteristics.

As shown in FIG. 2, a single subpixel includes a switching transistor SW, a driving transistor DR, a capacitor Cst, and an organic light-emitting diode OLED. A single subpixel may further comprise a compensation circuit CC.

The switching transistor SW switches to store a data voltage supplied via the first data line DL1 as a data voltage in the capacitor Cst, in response to a scan signal supplied via the first scan line GL1. The driving transistor DR works in such a way that a drive current flows between the first power supply line EVDD (high-level voltage) and the second power supply line EVSS (low-level voltage) in response to the data voltage stored in the capacitor Cst. The organic light-emitting diode OLED works in such a way as to emit light in response to the drive current formed by the driving transistor DR.

The compensation circuit CC is a circuit that is added into the subpixel to compensate for the threshold voltage, etc. of the driving transistor DR. The compensation circuit CC consists of one or more transistors. The compensation circuit CC may have many configurations depending on the method of compensation, so a description thereof will be omitted.

A process of manufacturing the aforementioned display panel may include a deposition process and a repair process. The deposition process is a process in which a conductive layer, a metal layer, and an insulating layer are deposited on a substrate to form structures such as elements (including electrodes), power supply lines, and signal lines. The repair process is a process in which defects on the structures formed on the substrate are repaired or defective subpixels are turned into dark dots.

The conventionally proposed repair method involves the risk of aperture ratio loss (or transmission loss) and requires the structures used in the repair process to be cut away or removed. Thus, there is a need for improvements in production yield and tact time. Accordingly, exemplary aspects for improving the conventionally proposed repair method will be described below.

Figure 3:
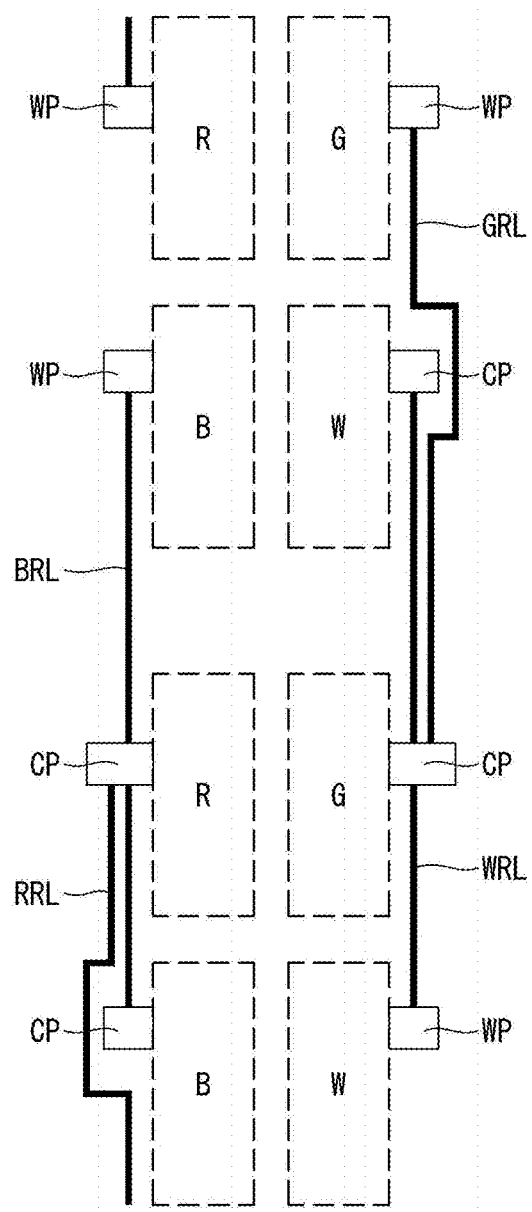
FIG. 3 is a plan view of the arrangement of subpixels to which a repair method according to a first exemplary aspect of the present disclosure is applicable.
Figure 4:
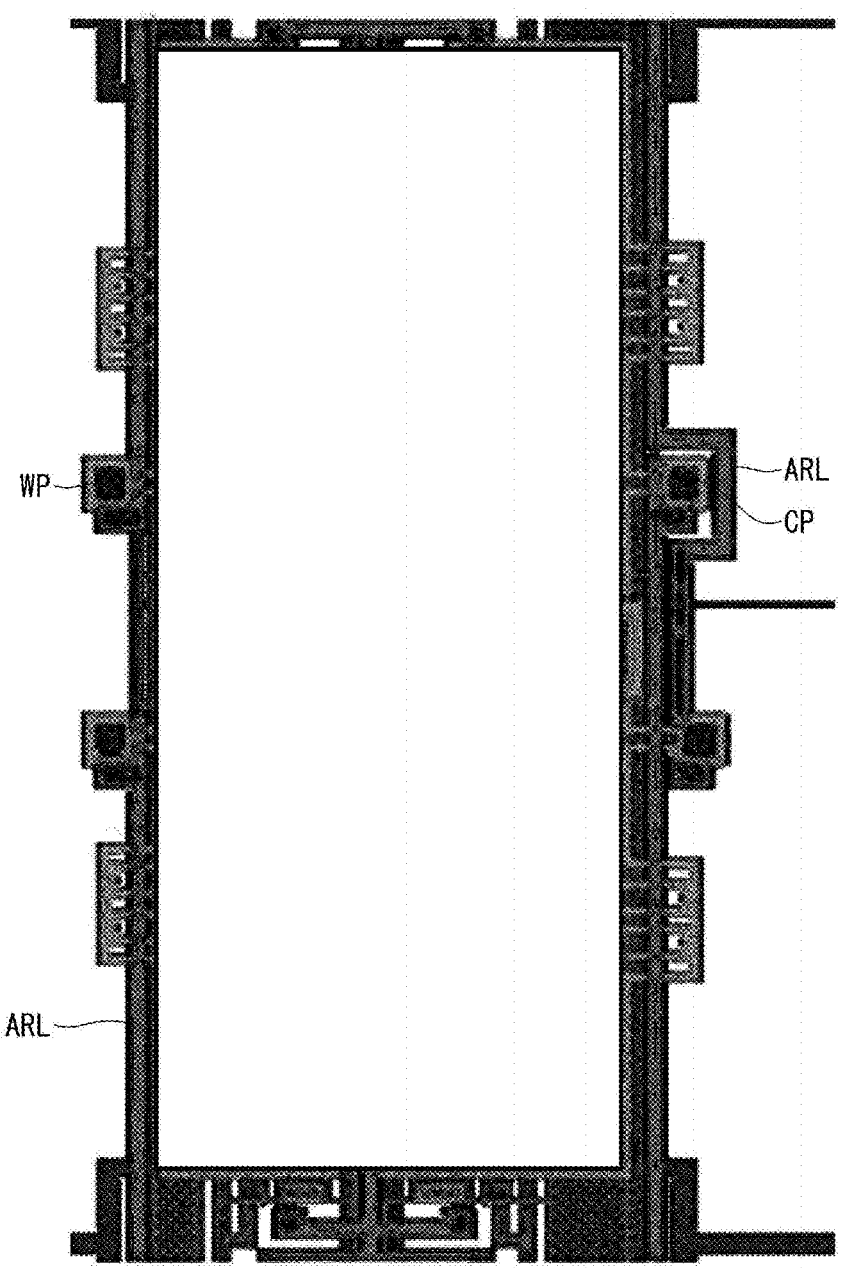
FIG. 4 is a plan view of the layout of subpixels according to the first exemplary aspect of FIG. 3.

FIG. 3 is a plan view of the arrangement of subpixels to which a repair method according to a first exemplary aspect of the present disclosure is applicable. FIG. 4 is a plan view of the layout of subpixels according to the first exemplary aspect of FIG. 3.

As shown in FIG. 3, the first exemplary aspect of the present disclosure is based on red, green, blue, and white subpixels R, G, B, and W. The red, green, blue, and white subpixels R, G, B, and W are arranged as a unit pixel. That is, a single pixel can be defined by red, green, blue, and white subpixels R, G, B, and W.

According to the first exemplary aspect of the present disclosure, red and green subpixels R and G are arranged on first and third scan lines, respectively, and blue and white subpixels B and W are arranged on second and fourth scan lines, respectively. However, this is merely an example, but the sequence of these subpixels may differ according to the light-emission characteristics, the lifetime of the elements, the specification of the device, and so on, and the present disclosure is not limited to this example.

According to the first exemplary aspect of the present disclosure, repair lines RRL, GRL, BRL, and WRL may be vertically arranged. As viewed from the plane, the repair lines RRL, GRL, BRL, and WRL have no overlapping regions. That is, the repair lines RRL, GRL, BRL, and WRL may be arranged in such a way that they do not overlap (non-overlap). Thus, all the repair lines RRL, GRL, BRL, and WRL are formed by electrodes on the same layer. For example, an electrode layer may be selected as source and drain electrodes of thin-film transistors.

One repair line RRL, GRL, BRL, and WRL may be allocated for at least every two subpixels that emit light of the same color and are vertically adjacent to each other. The repair lines RRL, GRL, BRL, and WRL serve to electrically connect at least two subpixels through the repair process.

One side of the repair lines RRL, GRL, BRL, and WRL has a contact point CP that makes contact with an electrode of a first subpixel, and the other side has a non-contact point WP that does not make contact with an electrode of a second subpixel. However, as the repair process proceeds, the electrode of the second subpixel and the non-contact point WP are electrically connected, and the electrode of the first subpixel and the electrode of the second subpixel become conductive via a repair line.

The repair lines RRL, GRL, BRL, and WRL include red repair lines RRL, green repair lines GRL, blue repair lines BRL, and white repair lines WRL. In an example, a green subpixel G arranged on a first scan line has a non-contact point WP and is connected to one side of a green repair line GRL, and a green subpixel G arranged on a third scan line has a contact point CP and is connected to the other side of the green repair line GRL.

In another example, a blue subpixel B arranged on a second scan line has a non-contact point WP and is connected to one side of a blue repair line BRL, and a blue subpixel B arranged on a fourth scan line has a contact point CP and is connected to the other side of the blue repair line BRL.

The red repair lines RRL, green repair lines GRL, blue repair lines BRL, and white repair line WRL are vertically arranged along non-light emission areas defined in the direction of the long axis of the subpixels R, G, B, and W. The red repair lines RRL, green repair lines GRL, blue repair lines BRL, and white repair line WRL are arranged in such a way that they do not overlap, in order to bypass the contact points CP or non-contact points WP of other repair lines.

As can be seen from the aforementioned two examples, the contact points CP and the non-contact points WP are located on one side and the other side of the repair lines RRL, GRL, BRL, and WRL. Also, the contact points CP and the non-contact points WP are not fixed in position, but their positions may be changed, considering the arrangement of the subpixels R, G, B, and W and other repair lines.

The contact points CP and the non-contact points WP may be arrayed in pairs on either side of the repair lines RRL, GRL, BRL, and WRL. The reason is because, by forming the contact points CP and the non-contact points WP in pairs, there is no need to cut away or remove the structures (repair lines) used in the repair process, and, as a result, production yield and process tact time can be improved. A description about this will be given in further details below.

FIG. 4 is a plan view of the layout of subpixels according to the first exemplary aspect of FIG. 3, which is attached to show the actual configuration of subpixels and repair lines without specifying them and used only for reference. In FIG. 4, ARL is a repair line, WP is a non-contact point, and CP is a contact point.

The foregoing first exemplary aspect has the advantage of repairing a defect occurring in a subpixel at a specific position by making contact with one terminal (contact point) in advance, but not the other terminal (non-contact point or open position), and welding the non-contact point once.

Figure 5:
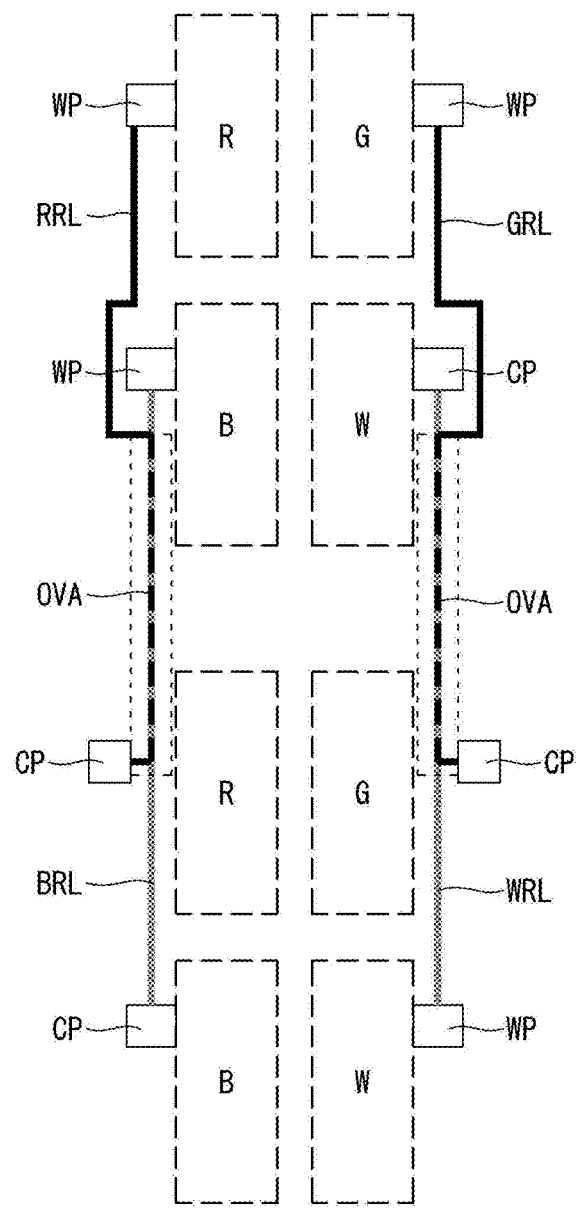
FIG. 5 is a plan view of the arrangement of subpixels to which a repair method according to a second exemplary aspect of the present disclosure is applicable.
Figure 6:
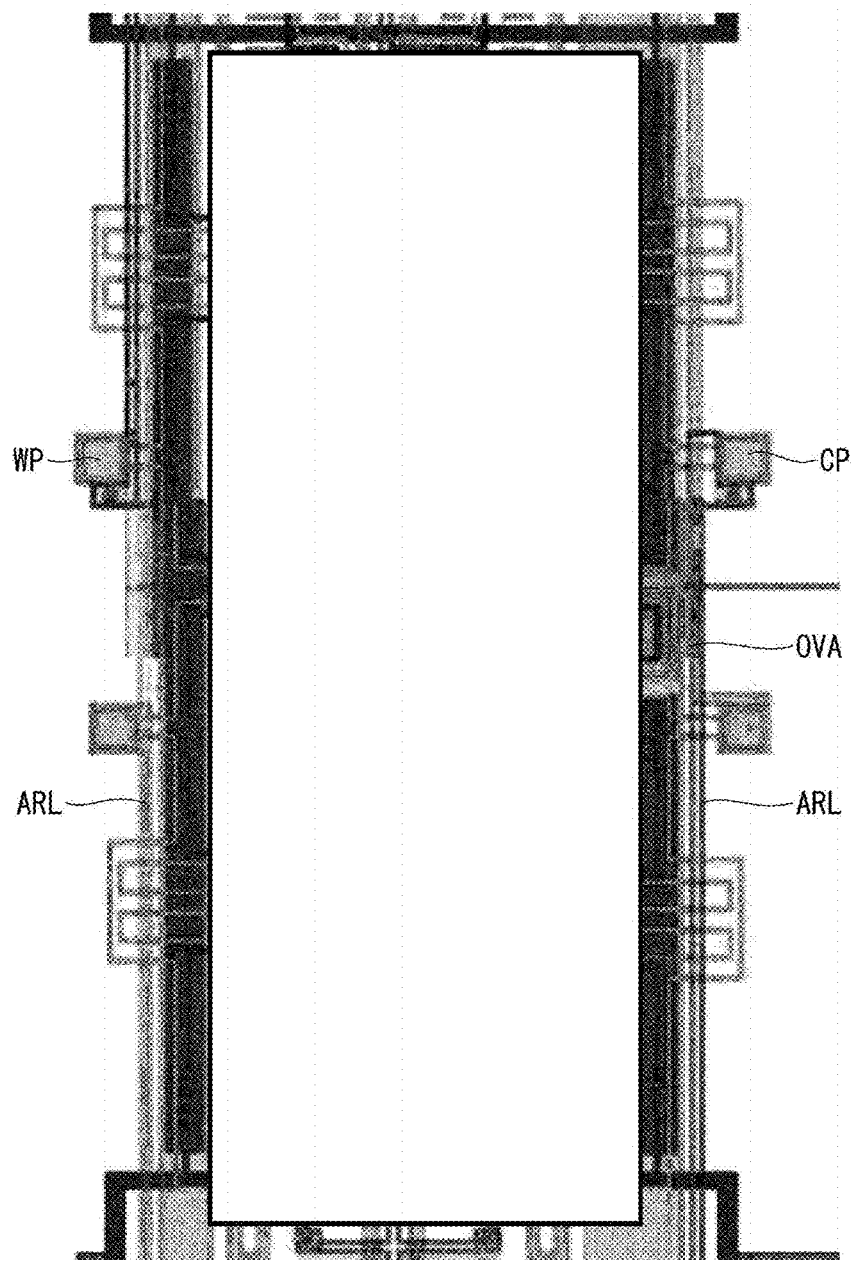
FIG. 6 is a plan view of the layout of subpixels according to the second exemplary aspect of FIG. 5.

FIG. 5 is a plan view of the arrangement of subpixels to which a repair method according to a second exemplary aspect of the present disclosure is applicable. FIG. 6 is a plan view of the layout of subpixels according to the second exemplary aspect of FIG. 5.

As shown in FIG. 5, the second exemplary aspect of the present disclosure is based on red, green, blue, and white subpixels R, G, B, and W. The red, green, blue, and white subpixels R, G, B, and W are arranged as a unit pixel. That is, a single pixel is defined by red, green, blue, and white subpixels R, G, B, and W.

According to the second exemplary aspect of the present disclosure, red and green subpixels R and G are arranged on first and third scan lines, respectively, and blue and white subpixels B and W are arranged on second and fourth scan lines, respectively. However, this is merely an example, but the sequence of these subpixels may differ according to the light-emission characteristics, the lifetime of the elements, the specification of the device, and so on, and the present disclosure is not limited to this example.

According to the second exemplary aspect of the present disclosure, repair lines RRL, GRL, BRL, and WRL may be vertically arranged. As viewed from the plane, the repair lines RRL, GRL, BRL, and WRL have overlapping regions OVA. That is, the repair lines RRL, GRL, BRL, and WRL may be arranged in such a way that they overlap—for example, they are allocated one overlapping region OVA for at least every two lines (e.g., one for every two scan lines if the repair lines are vertically arranged, or one for every two data lines if the repair lines are horizontally arranged). Thus, some of the repair lines RRL, GRL, BRL, and WRL are formed by lower electrodes on a lower layer, and the others are formed by upper electrodes on an upper layer. For example, a lower electrode layer may be selected as source and drain electrodes of thin-film transistors, and an upper electrode layer may be selected as lower electrodes (e.g., anodes) of organic light-emitting.

One repair line RRL, GRL, BRL, and WRL is allocated for at least every two subpixels that emit light of the same color and are vertically adjacent to each other. The repair lines RRL, GRL, BRL, and WRL serve to electrically connect at least two subpixels through the repair process.

One side of the repair lines RRL, GRL, BRL, and WRL has a contact point CP that makes contact with an electrode of a first subpixel, and the other side has a non-contact point WP that does not make contact with an electrode of a second subpixel. However, as the repair process proceeds, the electrode of the second subpixel and the non-contact point WP are electrically connected, and the electrode of the first subpixel and the electrode of the second subpixel become conductive via a repair line.

The repair lines RRL, GRL, BRL, and WRL comprise red repair lines RRL, green repair lines GRL, blue repair lines BRL, and white repair lines WRL. In an example, a green subpixel G arranged on a first scan line has a non-contact point WP and is connected to one side of a green repair line GRL, and a green subpixel G arranged on a third scan line has a contact point CP and is connected to the other side of the green repair line GRL. The green repair line GRL and the white repair line WRL have a partially overlapping region OVA.

In another example, a blue subpixel B arranged on a second scan line has a non-contact point WP and is connected to one side of a blue repair line BRL, and a blue subpixel B arranged on a fourth scan line has a contact point CP and is connected to the other side of the blue repair line BRL. The blue repair line BRL and the red repair line RRL have a partially overlapping region OVA.

As can be seen from the aforementioned two examples, the contact points CP and the non-contact points WP are located on one side and the other side of the repair lines RRL, GRL, BRL, and WRL. Also, the contact points CP and the non-contact points WP are not fixed in position, but their positions may be changed, considering the arrangement of the subpixels R, G, B, and W and other repair lines.

The contact points CP and the non-contact points WP may be arrayed in pairs on either side of the repair lines RRL, GRL, BRL, and WRL. The reason is because, by forming the contact points CP and the non-contact points WP in pairs, there is no need to cut away or remove the structures (repair lines) used in the repair process, and, as a result, production yield and process tact time can be improved. A description about this will be given in further details below.

FIG. 6 is a plan view of the layout of subpixels according to the second exemplary aspect of FIG. 5, which is attached to show the actual configuration of subpixels and repair lines without specifying them and used only for reference. In FIG. 6, ARL is a repair line, WP is a non-contact point, CP is a contact point, and OVA is an overlapping region between repair lines on different layers.

The foregoing second exemplary aspect has the advantage of repairing a defect occurring in a subpixel at a specific position by making contact with one terminal (contact point)

in advance, but not the other terminal (non-contact point or open position), and welding the non-contact point once.

Moreover, the second exemplary aspect can minimize the reduction in aperture ratio caused by the addition of repair lines since the repair lines are formed on different layers and overlap. In addition, the second exemplary aspect has been described with an example in which contact points and non-contact points are formed respectively on either side of the repair lines. However, this is merely an example, and the non-contact points may be formed on both sides of the repair lines. In this case, although the reduction in aperture ratio can be minimized, laser welding has to be carried out twice because there are two non-contact points.

Figure 7:
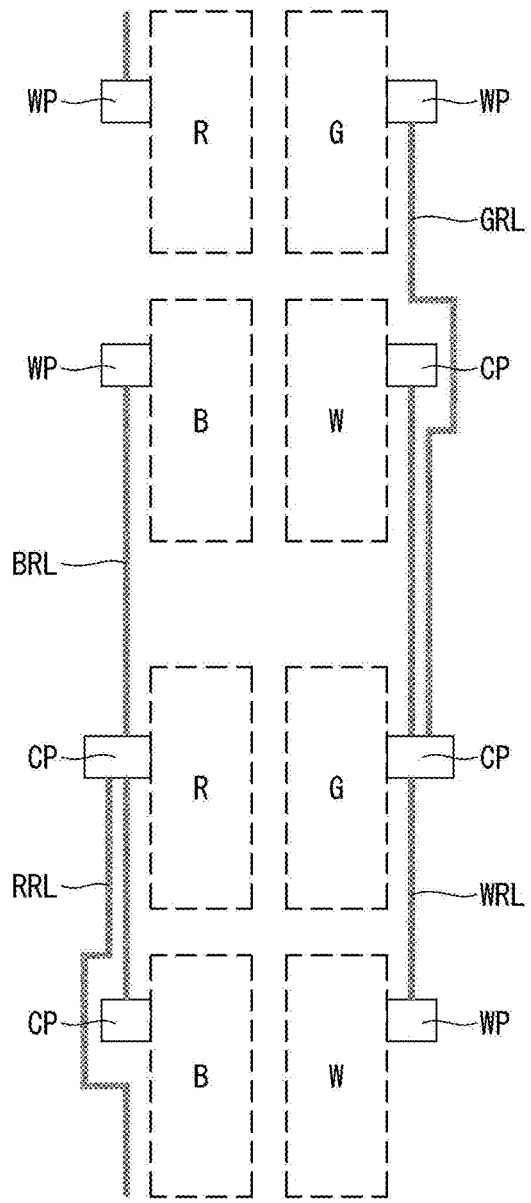
FIG. 7 is a plan view of the arrangement of subpixels to which a repair method according to a third exemplary aspect of the present disclosure is applicable.
Figure 8:
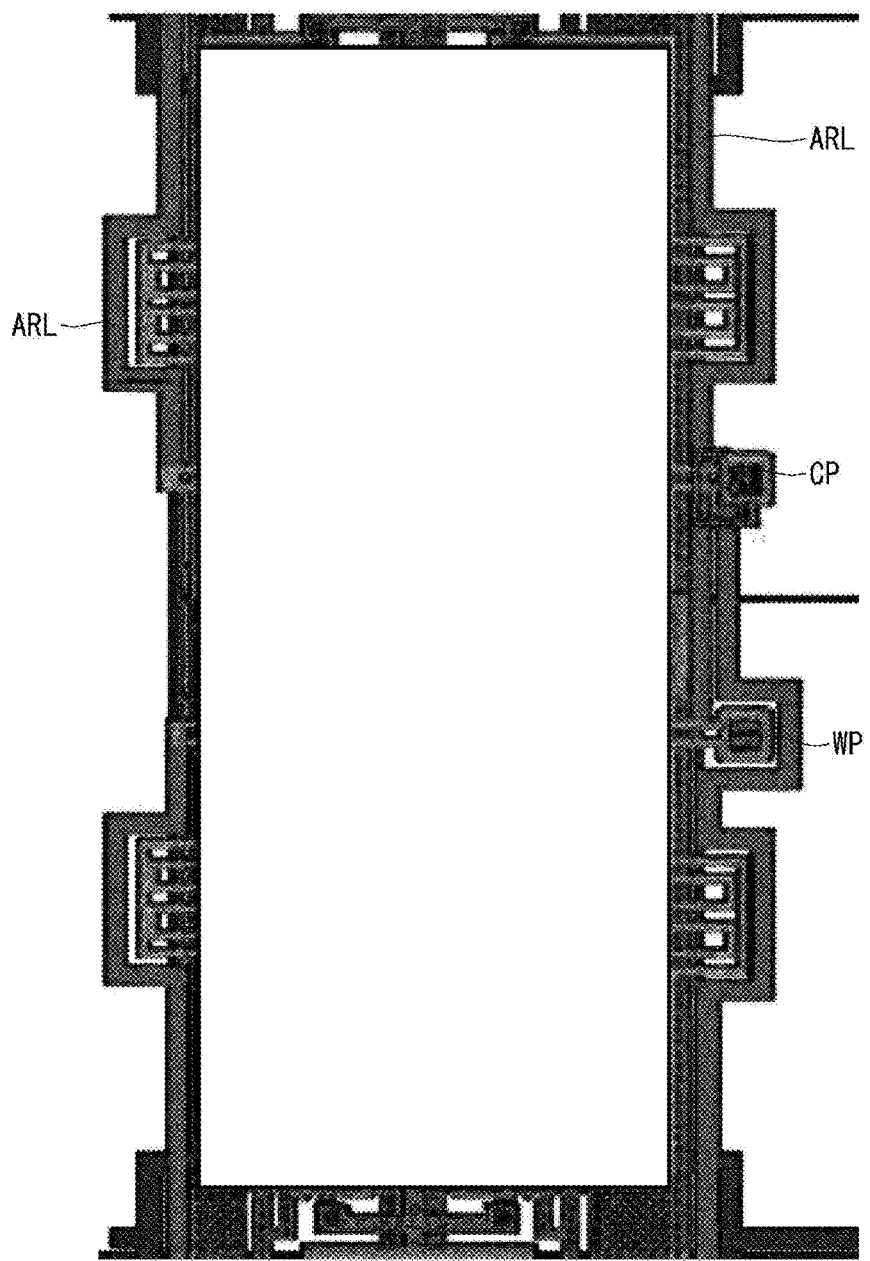
FIG. 8 is a plan view of the layout of subpixels according to the third exemplary aspect of FIG. 7.

FIG. 7 is a plan view of the arrangement of subpixels to which a repair method according to a third exemplary aspect of the present disclosure is applicable. FIG. 8 is a plan view of the layout of subpixels according to the third exemplary aspect of FIG. 7.

As shown in FIG. 7, the third exemplary aspect of the present disclosure is based on red, green, blue, and white subpixels R, G, B, and W. The red, green, blue, and white subpixels R, G, B, and W are arranged as a unit pixel. That is, a single pixel is defined by red, green, blue, and white subpixels R, G, B, and W.

According to the third exemplary aspect of the present disclosure, red and green subpixels R and G are arranged on first and third scan lines, respectively, and blue and white subpixels B and W are arranged on second and fourth scan lines, respectively. However, this is merely an example, but the sequence of these subpixels may differ according to the light-emission characteristics, the lifetime of the elements, the specification of the device, and so on, and the present disclosure is not limited to this example.

According to the third exemplary aspect of the present disclosure, repair lines RRL, GRL, BRL, and WRL may be vertically arranged. As viewed from the plane, the repair lines RRL, GRL, BRL, and WRL have no overlapping regions. That is, the repair lines RRL, GRL, BRL, and WRL may be arranged in such a way that they do not overlap (non-overlap). Thus, all the repair lines RRL, GRL, BRL, and WRL are formed by electrodes on the same layer. For example, an electrode layer may be selected as lower electrodes (e.g., transparent electrodes) of organic light-emitting diodes.

One repair line RRL, GRL, BRL, and WRL is allocated for at least every two subpixels that emit light of the same color and are vertically adjacent to each other. The repair lines RRL, GRL, BRL, and WRL serve to electrically connect at least two subpixels through the repair process.

One side of the repair lines RRL, GRL, BRL, and WRL has a contact point CP that makes contact with an electrode of a first subpixel, and the other side has a non-contact point WP that does not make contact with an electrode of a second subpixel. However, as the repair process proceeds, the electrode of the second subpixel and the non-contact point WP are electrically connected, and the electrode of the first subpixel and the electrode of the second subpixel become conductive via a repair line.

The repair lines RRL, GRL, BRL, and WRL comprise red repair lines RRL, green repair lines GRL, blue repair lines BRL, and white repair lines WRL. In an example, a green subpixel G arranged on a first scan line has a non-contact point WP and is connected to one side of a green repair line GRL, and a green subpixel G arranged on a third scan line has a contact point CP and is connected to the other side of the green repair line GRL.

In another example, a blue subpixel B arranged on a second scan line has a non-contact point WP and is connected to one side of a blue repair line BRL, and a blue subpixel B arranged on a fourth scan line has a contact point CP and is connected to the other side of the blue repair line BRL.

As can be seen from the aforementioned two examples, the contact points CP and the non-contact points WP are located on one side and the other side of the repair lines RRL, GRL, BRL, and WRL. Also, the contact points CP and the non-contact points WP are not fixed in position, but their positions may be changed, considering the arrangement of the subpixels R, G, B, and W and other repair lines.

The contact points CP and the non-contact points WP may be arrayed in pairs on either side of the repair lines RRL, GRL, BRL, and WRL. The reason is because, by forming the contact points CP and the non-contact points WP in pairs, there is no need to cut away or remove the structures (repair lines) used in the repair process, and, as a result, production yield and process tact time can be improved. A description about this will be given in further details below.

FIG. 8 is a plan view of the layout of subpixels according to the third exemplary aspect of FIG. 7, which is attached to show the actual configuration of subpixels and repair lines without specifying them and used only for reference. In FIG. 8, ARL is a repair line, WP is a non-contact point, and CP is a contact point.

The foregoing third exemplary aspect has the advantage of repairing a defect occurring in a subpixel at a specific position by making contact with one terminal (contact point) in advance, but not the other terminal (non-contact point or open position), and welding the non-contact point once. Moreover, the third exemplary aspect can minimize the reduction in aperture ratio caused by the addition of repair lines since the repair lines are formed of transparent electrodes that allow light to pass through.

Below is a detailed description of a cross-section of subpixels to which a repair method according to the third exemplary aspect of the present disclosure is applicable.

Figure 9:
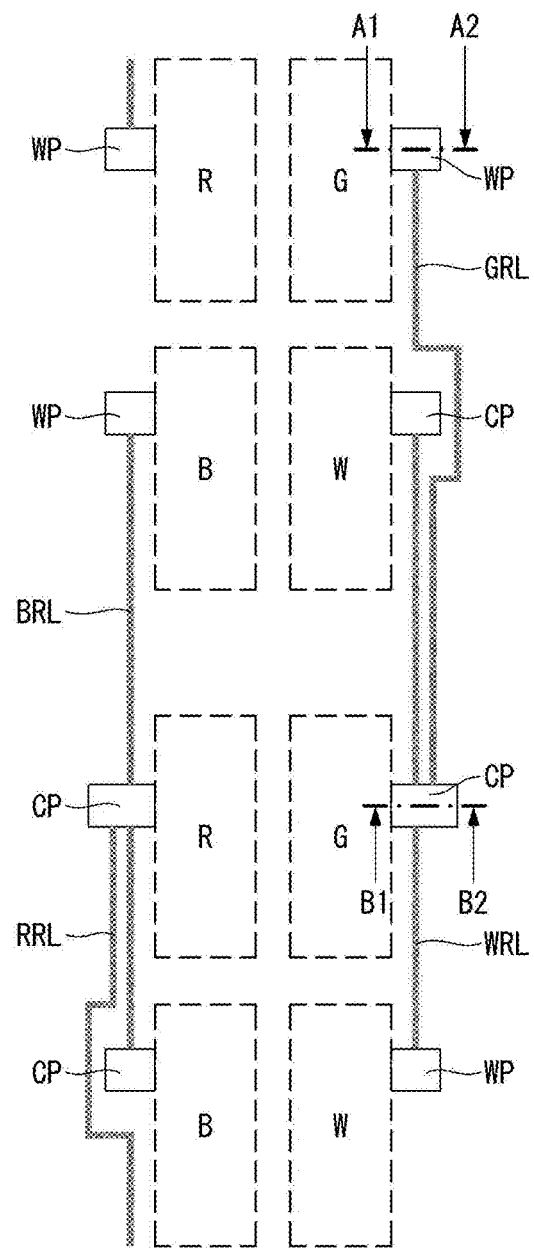
FIG. 9 is a plan view of the arrangement of subpixels to which a repair method according to the third exemplary aspect of the present disclosure is applicable.
Figure 10:
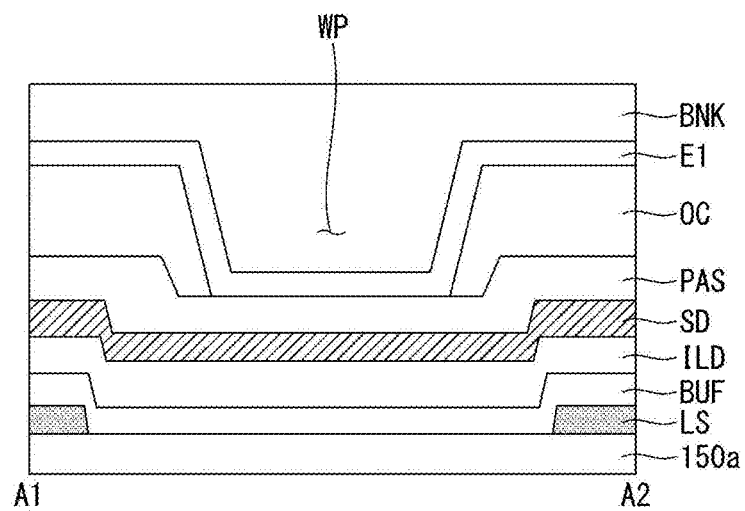
FIG. 10 is a cross-sectional view of the region A1-A2 in FIG. 9.
Figure 11:
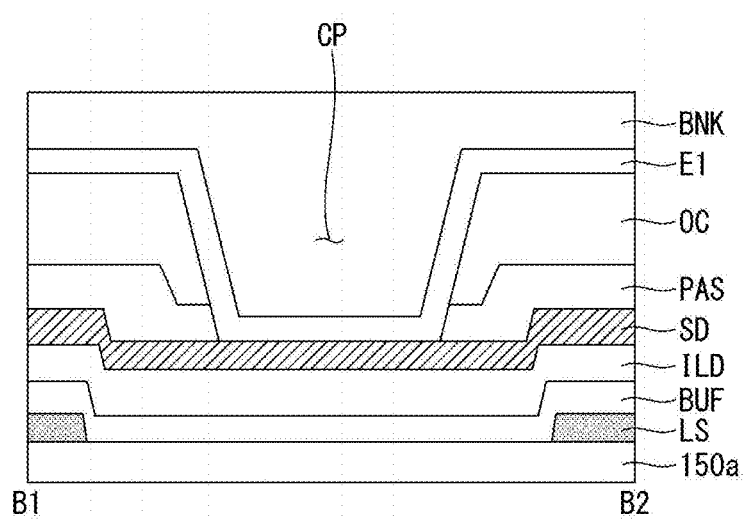
FIG. 11 is a cross-section of the region B1-B2 in FIG. 9.

FIG. 9 is a plan view of the arrangement of subpixels to which a repair method according to the third exemplary aspect of the present disclosure is applicable. FIG. 10 is a cross-sectional view of the region A1-A2 in FIG. 9. FIG. 11 is a cross-section of the region B1-B2 in FIG. 9.

As shown in FIGS. 9 and 10, a lower electrode layer E1 and source-drain electrode layer SD located at a non-contact point WP are electrically separated by an insulating material. The structures shown at the non-contact point WP are as follows.

A light blocking layer LS is located on a first substrate 150a. The light blocking layer LS serves to block (prevent) light from entering a channel region (semiconductor region) of a thin-film transistor. The light blocking layer LS is made of a metal material capable of blocking light transmission. The light blocking layer LS may be omitted depending on the thin-film transistor structure.

A buffer layer BUF is located on the first substrate 150a. The buffer layer BUF serves to electrically insulate the light blocking layer LS or prevent effects of material leaking from the first substrate 150a. The buffer layer BUF is configured to cover the light blocking layer LS.

A first insulating layer ILD is located on the buffer layer BUF. The first insulating layer ILD may be composed of a single layer of silicon nitride (SiNx) or silicon oxide (SiOx) or multiple layers of silicon nitride (SiNx) and silicon oxide (SiOx).

The source-drain electrode layer SD is located on the first insulating layer ILD. The source-drain electrode layer SD may be formed of one of molybdenum (Mo), aluminum (Al), chrome (Cr), gold (Au), titanium (Ti), nickel (Ni), and copper (Cu) or an alloy thereof, and may be composed of a single layer or multiple layers. The source-drain electrode layer SD is made of the same metal material as the source and drain electrodes of the thin-film transistor. The source-drain electrode layer SD is an extension from an electrode of a driving transistor included in a green subpixel G on a first scan line (an electrode connected to the organic light-emitting diode).

A passivation layer PAS is located on the source-drain electrode layer SD. The passivation layer PAS may be composed of a single layer of silicon nitride (SiNx) or silicon oxide (SiOx) or multiple layers of silicon nitride (SiNx) and silicon oxide (SiOx).

A planarization layer OC with a recessed contact hole corresponding to the non-contact point WP is located on the passivation layer PAS. The planarization layer OC planarizes the surface of a transistor array including thin-film transistors. The planarization layer OC may be made of organic material such as an overcoat layer, polyimide, benzocyclobutene series resin, acrylate, and photoacryl.

The lower electrode layer E1 is located on the planarization layer OC. The lower electrode layer E1 is located within the contact hole in the planarization layer OC. The lower electrode layer E1 may be formed of transparent electrodes that allow light to pass through—for example, oxides such as ITO (indium tin oxide) and IZO (indium zinc oxide). The lower electrode layer E1 is made of the same layer and same material as the electrode of the organic light-emitting diode included in the green subpixel G on the first scan line, but is separated from it.

A bank layer BNK is located on the lower electrode layer E1. The bank layer BNK defines light emission areas (or aperture areas) of subpixels. The bank layer BNK may be made of organic material or inorganic material.

As shown in FIGS. 9 and 11, a lower electrode layer E1 and source-drain electrode layer SD located at a contact point CP are electrically connected. The structures shown at the non-contact point WP are as follows.

A light blocking layer LS is located on a first substrate 150a. The light blocking layer LS serves to block (prevent) light from entering a channel region (semiconductor region) of a thin-film transistor. The light blocking layer LS is made of a metal material capable of blocking light transmission. The light blocking layer LS may be omitted depending on the thin-film transistor structure.

A buffer layer BUF is located on the first substrate 150a. The buffer layer BUF serves to electrically insulate the light blocking layer LS or prevent effects of material leaking from the first substrate 150a. The buffer layer BUF is configured to cover the light blocking layer LS.

A first insulating layer ILD is located on the buffer layer BUF. The first insulating layer ILD may be composed of a single layer of silicon nitride (SiNx) or silicon oxide (SiOx) or multiple layers of silicon nitride (SiNx) and silicon oxide (SiOx).

The source-drain electrode layer SD is located on the first insulating layer ILD. The source-drain electrode layer SD may be formed of one of molybdenum (Mo), aluminum (Al), chrome (Cr), gold (Au), titanium (Ti), nickel (Ni), and copper (Cu) or an alloy thereof, and may be composed of a single layer or multiple layers. The source-drain electrode layer SD is made of the same metal material as the source and drain electrodes of the thin-film transistor. The source-drain electrode layer SD is an extension from an electrode of a driving transistor included in a green subpixel G on the first scan line (an electrode connected to the organic light-emitting diode).

A passivation layer PAS with a contact hole corresponding to a contact point CP is located on the source-drain electrode layer SD. The passivation layer PAS may be composed of a single layer of silicon nitride (SiNx) or silicon oxide (SiOx) or multiple layers of silicon nitride (SiNx) and silicon oxide (SiOx).

A planarization layer OC with a recessed contact hole corresponding to the contact point CP is located on the passivation layer PAS. The planarization layer OC planarizes the surface of a transistor array including thin-film transistors. The planarization layer OC may be made of organic material such as an overcoat layer, polyimide, benzocyclobutene series resin, acrylate, and photoacryl.

The lower electrode layer E1 is located on the planarization layer OC. The lower electrode layer E1 is located within the contact hole in the planarization layer OC. The lower electrode layer E1 may be formed of transparent electrodes that allow light to pass through—for example, oxides such as ITO (indium tin oxide) and IZO (indium zinc oxide). The lower electrode layer E1 is electrically connected to the source-drain electrode layer SD via the contact holes formed in the planarization layer OC and passivation layer PAS.

A bank layer BNK is located on the lower electrode layer E1. The bank layer BNK defines light emission areas (or aperture areas) of subpixels. The bank layer BNK may be made of organic material or inorganic material.

In what follows, structural changes in the electrodes due to a repair will be described with an example in which a defect occurs in one of the green subpixels on the first and third scan lines and a repair process for repairing this defect is carried out.

Figure 12:
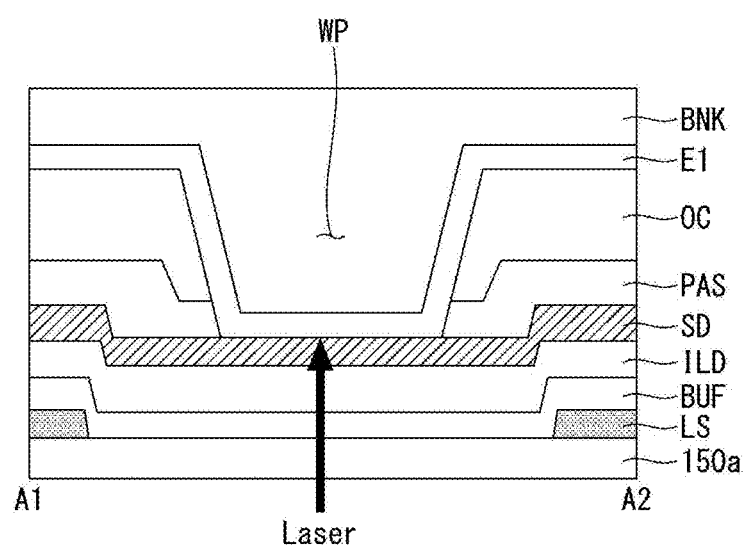
FIG. 12 is a cross-sectional view of the region A1-A2 in FIG. 9 after laser welding.
Figure 13:
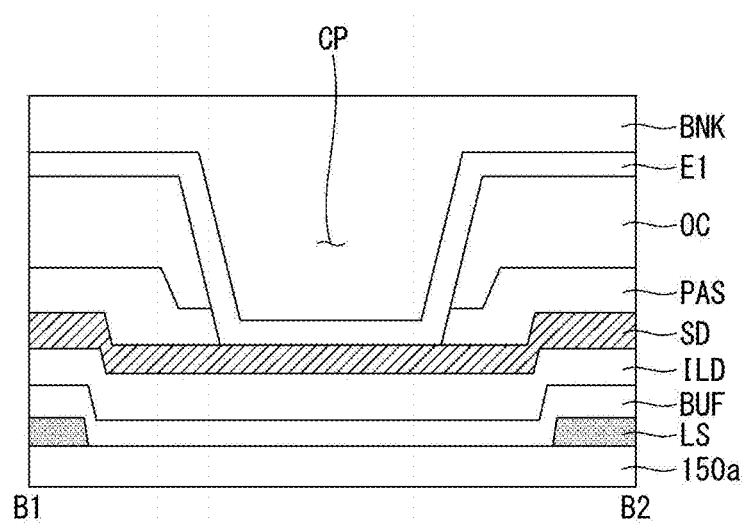
FIG. 13 is a cross-sectional view of the region B1-B2 in FIG. 9 after laser welding.
Figure 14:
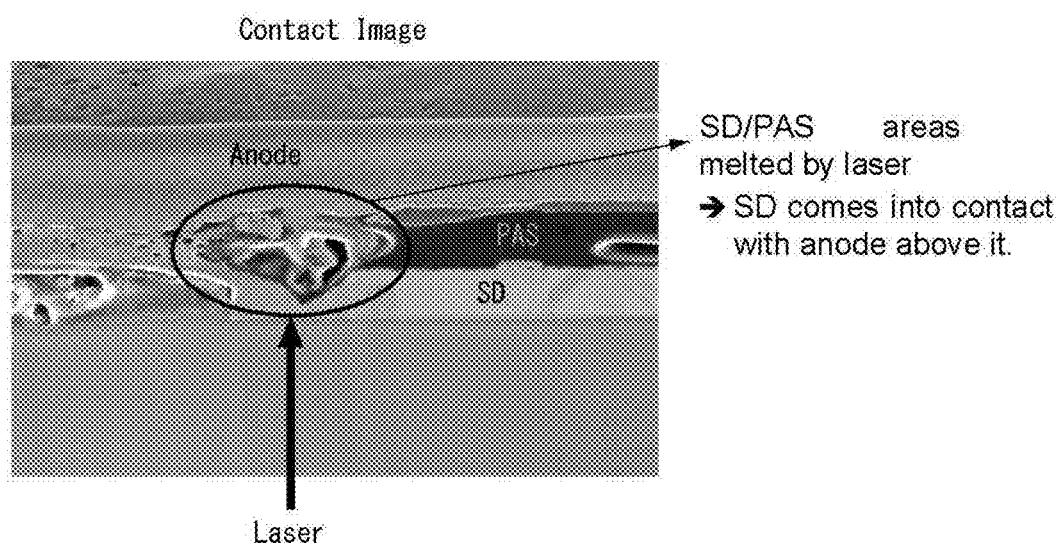
FIG. 14 is a photograph of electrodes that have turned into a conducting state after a repair process according to the present disclosure.

FIG. 12 is a cross-sectional view of the region A1-A2 in FIG. 9 after laser welding. FIG. 13 is a cross-sectional view of the region B1-B2 in FIG. 9 after laser welding. FIG. 14 is a photograph of electrodes that have turned into a conducting state after a repair process according to the present disclosure.

As shown in FIGS. 9, 12, and 13, the non-contact point WP in the non-light emission area of the green subpixel G on the first scan line may be irradiated with a laser. By the laser irradiation, the source-drain electrode SD and the passivation layer PAS are melted. In turn, the source-drain electrode SD and the lower electrode E1 are electrically connected.

The lower electrode layer E1 allows the green subpixels G on the first and third scan lines to share the electrodes of the driving transistors. As a result, even if one of the two subpixels becomes operationally defective (inoperable), normal driving can be done by Since FIG. 12, by its nature, cannot clearly depict the source-drain electrode layer SD and passivation layer PAS in a melted state, this melted state will be shown clearly with reference to FIG. 14.

As shown in FIG. 14, the source/drain electrodes layer SD and the passivation layer PAS are melted when irradiated with a laser. As the passivation layer PAS is melted, the insulation between the source-drain electrode layer SD and the anode electrode layer (lower electrode layer E1 of this disclosure) breaks down. The melted source-drain electrode layer SD comes into contact with the anode electrode layer (lower electrode layer E1 of this disclosure) located above it.

As can be seen from above, in the present disclosure, one repair line is allocated for at least every two subpixels that emit light of the same color and are adjacent to each other, which allows for easy repair of any operational defect occurring in one of the two subpixels by a one-time repair process. Moreover, the present disclosure can improve production yield and process tact time, since there is no need to cut away or remove repair lines used in the repair process. Additionally, the present disclosure can minimize the reduction in aperture ratio caused by the addition of repair lines.

What is claimed is:

1. An electroluminescence display comprising:
   a first substrate;
   a plurality of subpixels arranged on the first substrate; and
   a plurality of repair lines located on the first substrate, at least one for every two adjacent subpixels emitting same color light,
   wherein the plurality of subpixels further comprises:
   a first insulating layer on the first substrate;
   source/drain electrodes of a transistor in a first subpixel on the first insulating layer;
   a passivation layer on the source/drain electrodes;
   a planarization layer on the passivation layer; and
   a low electrode of an organic light-emitting diode in a second subpixel on the planarization layer,
   wherein a portion of each of the plurality of repair lines is formed of the same material as the source/drain electrodes and is contacted to the source/drain electrodes, and a remaining portion of each of the plurality of repair lines is formed of the same material as the lower electrode and is contacted to the lower electrode, and
   wherein the portion of each of the plurality of repair lines and the remaining portion overlap with each other with the passivation layer and the planarization layer interposed therebetween.

2. The electroluminescence display of claim 1, wherein the plurality of repair lines is vertically arranged along non-light emission areas defined in a direction of a long axis of the plurality of subpixels.

3. An electroluminescence display comprising:
   a first substrate;
   a plurality of subpixels arranged on the first substrate; and
   a plurality of repair lines on the first substrate, at least one for every two adjacent subpixels emitting same color light,
   wherein each of the plurality of repair lines includes a first side having a contact point contacting an electrode of a first subpixel and a second side having a non-contact point with an electrode of a second subpixel, and
   wherein the plurality of subpixels further comprises:
   a buffer layer on the first substrate;
   a first insulating layer on the buffer layer;
   a first source/drain electrode of a first subpixel and a second source/drain electrode of a second subpixel on the first insulating layer and extending to the contact points or the non-contact points;
   a passivation layer on the first and second source/drain electrodes and having a first contact hole at the contact point; and
   a planarization layer on the passivation layer and having a second contact hole over the first contact hole at the contact point and a recessed contact hole at the non-contact point, and
   wherein each of the plurality of repair lines comprises a lower electrode layer on the planarization layer, and the lower electrode layer is electrically contacted to the first source/drain electrode through the first and second contact holes at the contact point and is overlapped with the second source/drain electrode through the recessed contact hole at the non-contact point.

4. The electroluminescence display of claim 3, wherein the lower electrode layer is vertically arranged along non-light emission areas defined in a direction of a long axis of the plurality of subpixels.

5. The electroluminescence display of claim 3, wherein the passivation layer includes a melted portion at the non-contact point.

6. The electroluminescence display of claim 3, wherein the second source/drain electrode and the lower electrode are electrically connected when the second source/drain electrode and the passivation layer are melted by irradiating the non-contact point with laser.

7. An electroluminescence display comprising:
   first and second unit pixels adjacent to each other, each unit pixel includes red, green, blue and white subpixels disposed on a substrate, wherein each of the red, green, blue and white subpixels of the first and second unit pixels has either a contact point or a non-contact point, wherein the contact point contacts an electrode of the subpixels and the non-contact point does not contact the electrode of the subpixels; and
   a repair line connected among the red, green, blue and white subpixels emitting same color light through the contact point and the non-contact point,
   wherein each of the subpixels comprises:
   a buffer layer located on the substrate;
   a first insulating layer located on the buffer layer;
   a first source/drain electrode of a first subpixel in the first unit pixel and a second source/drain electrode of a second subpixel in the second unit pixel on the first insulating layer and extending to the contact point or the non-contact point;
   a passivation layer on the first and second source/drain electrodes and having a first contact hole at the contact point; and
   a planarization layer on the passivation layer and having a second contact hole over the first contact hole at the contact point and a recessed contact hole at the non-contact point,
   wherein the repair line comprises a lower electrode layer on the planarization layer, and the lower electrode layer is electrically contacted to the first source/drain electrode through the first and second contact holes at the contact point and is overlapped with the second source/drain electrode through the recessed contact hole at the non-contact point.

8. The electroluminescence display of claim 7, wherein the passivation layer includes a melted point at the non-contact point.

9. The electroluminescence display of claim 7, wherein the second source/drain electrode and the lower electrode are electrically connected when the second source/drain electrode and the passivation layer are melted by irradiating the non-contact point with laser.

10. The electroluminescence display of claim 7, wherein the lower electrode is vertically arranged along non-light emission areas defined in a direction of a long axis of the subpixels.

* * * * *